US012211935B2

(12) United States Patent
Chu et al.

(10) Patent No.: US 12,211,935 B2
(45) Date of Patent: *Jan. 28, 2025

(54) SEMICONDUCTOR STRUCTURE AND ASSOCIATED FABRICATING METHOD

(71) Applicant: TAIWAN SEMICONDUCTOR MANUFACTURING COMPANY LTD., Hsinchu (TW)

(72) Inventors: Chen-Liang Chu, Hsin-Chu (TW); Ta-Yuan Kung, New Taipei (TW); Ker-Hsiao Huo, Hsinchu County (TW); Yi-Huan Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/057,220

(22) Filed: Nov. 20, 2022

(65) Prior Publication Data
US 2023/0080932 A1 Mar. 16, 2023

Related U.S. Application Data

(60) Continuation of application No. 17/028,796, filed on Sep. 22, 2020, now Pat. No. 11,508,845, which is a
(Continued)

(51) Int. Cl.
*H01L 29/78* (2006.01)
*H01L 23/522* (2006.01)
(Continued)

(52) U.S. Cl.
CPC ...... *H01L 29/7836* (2013.01); *H01L 23/5226* (2013.01); *H01L 29/0615* (2013.01); *H01L 29/1045* (2013.01); *H01L 29/665* (2013.01); *H01L 29/66659* (2013.01); *H01L 29/7835* (2013.01)

(58) Field of Classification Search
CPC ............. H01L 29/7836; H01L 23/5226; H01L 29/665; H01L 29/66659; H01L 29/0615
See application file for complete search history.

(56) References Cited

U.S. PATENT DOCUMENTS 5,264,719 A * 11/1993 Beasom ................ H01L 29/735
257/E29.066
5,591,661 A * 1/1997 Shiota ................. H01L 27/0255
438/237
(Continued)

*Primary Examiner* — Jarrett J Stark
(74) *Attorney, Agent, or Firm* — WPAT LAW; Anthony King

(57) ABSTRACT

A semiconductor structure is disclosed. The semiconductor structure includes: a substrate of a first conductivity; a first region of the first conductivity formed in the substrate; a second region of the first conductivity formed in the first region, wherein the second region has a higher doping density than the first region; a source region of a second conductivity formed in the second region; a drain region of the second conductivity formed in the substrate; a pickup region of the first conductivity formed in the second region and adjacent to the source region; and a resist protective oxide (RPO) layer formed on a top surface of the second region. An associated fabricating method is also disclosed.

20 Claims, 11 Drawing Sheets

Related U.S. Application Data continuation of application No. 15/815,376, filed on Nov. 16, 2017, now Pat. No. 10,847,652, which is a division of application No. 15/017,197, filed on Feb. 5, 2016, now Pat. No. 9,831,340.

(51) Int. Cl.
  *H01L 29/06* (2006.01)
  *H01L 29/10* (2006.01)
  *H01L 29/66* (2006.01)

(56) References Cited

U.S. PATENT DOCUMENTS

| | | | | |
|---|---|---|---|---|
| 6,319,784 | B1* | 11/2001 | Yu | H01L 29/665 |
| | | | | 438/303 |
| 6,392,274 | B1* | 5/2002 | Tung | H01L 29/1083 |
| | | | | 257/E29.054 |
| 8,575,702 | B2* | 11/2013 | Cha | H01L 21/823412 |
| | | | | 438/294 |
| 9,564,436 | B2* | 2/2017 | Wen | H01L 27/0277 |
| 9,653,459 | B2* | 5/2017 | Chou | H01L 29/0852 |
| 10,211,290 | B2* | 2/2019 | Lai | H01L 29/78 |
| 2004/0038485 | A1* | 2/2004 | Pong | H01L 29/7835 |
| | | | | 257/E29.268 |
| 2005/0112826 | A1* | 5/2005 | Chen | H01L 29/66659 |
| | | | | 257/E29.268 |
| 2007/0290241 | A1* | 12/2007 | Adachi | H01L 27/14603 |
| | | | | 257/292 |
| 2008/0166849 | A1* | 7/2008 | Yang | H01L 29/1083 |
| | | | | 438/305 |
| 2009/0001462 | A1* | 1/2009 | Huang | H01L 29/0847 |
| | | | | 257/E29.268 |
| 2009/0256200 | A1* | 10/2009 | Yao | H01L 29/7833 |
| | | | | 257/345 |
| 2010/0052057 | A1* | 3/2010 | Chung | H01L 29/66659 |
| | | | | 257/E29.255 |
| 2011/0115016 | A1* | 5/2011 | Cha | H01L 29/4238 |
| | | | | 257/E27.016 |
| 2011/0266614 | A1* | 11/2011 | Khan | H01L 29/7835 |
| | | | | 257/E29.261 |
| 2012/0086052 | A1* | 4/2012 | Chen | H01L 29/0607 |
| | | | | 257/E21.418 |
| 2012/0211832 | A1* | 8/2012 | Chu | H01L 29/7835 |
| | | | | 257/E29.261 |
| 2013/0093015 | A1* | 4/2013 | Pal | H01L 29/7816 |
| | | | | 438/285 |
| 2013/0161739 | A1* | 6/2013 | Tseng | H01L 29/7835 |
| | | | | 438/286 |
| 2013/0299919 | A1* | 11/2013 | Chen | H01L 29/66492 |
| | | | | 257/E21.409 |
| 2014/0008724 | A1* | 1/2014 | Chou | H01L 29/1083 |
| | | | | 257/E27.06 |
| 2014/0045304 | A1* | 2/2014 | Chou | H01L 21/28 |
| | | | | 438/585 |
| 2014/0210007 | A1* | 7/2014 | Deval | H01L 29/7393 |
| | | | | 257/350 |
| 2014/0252472 | A1* | 9/2014 | Chen | H01L 29/7816 |
| | | | | 438/286 |
| 2015/0084134 | A1* | 3/2015 | Lin | H01L 27/0266 |
| | | | | 257/401 |
| 2016/0056285 | A1* | 2/2016 | Chiang | H01L 29/7816 |
| | | | | 257/344 |
| 2017/0018591 | A1* | 1/2017 | Yamaguchi | H01L 27/14616 |
| 2017/0194439 | A1* | 7/2017 | Wu | H01L 29/402 |
| 2017/0263599 | A1* | 9/2017 | Lai | H01L 29/0821 |
| 2019/0252258 | A1* | 8/2019 | Huang | H01L 29/808 |

\* cited by examiner

SEMICONDUCTOR STRUCTURE AND ASSOCIATED FABRICATING METHOD

CROSS-REFERENCE TO RELATED APPLICATIONS

This application is a continuation of U.S. application Ser. No. 17/028,796, field on Sep. 22, 2020, which is a continuation of U.S. application Ser. No. 15/815,376, filed on Nov. 16, 2017, which is a division of U.S. application Ser. No. 15/017,197, filed on Feb. 5, 2016, and claims priority thereto.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, commensurate developments in IC processing and manufacturing are needed. For example, as semiconductor circuits composed of devices such as metal-oxide-semiconductor field effect transistors (MOSFETs) are adapted for high voltage applications, problems arise when incorporating a high voltage device with a low voltage device (e.g., a logic device) for system-on-chip (SoC) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
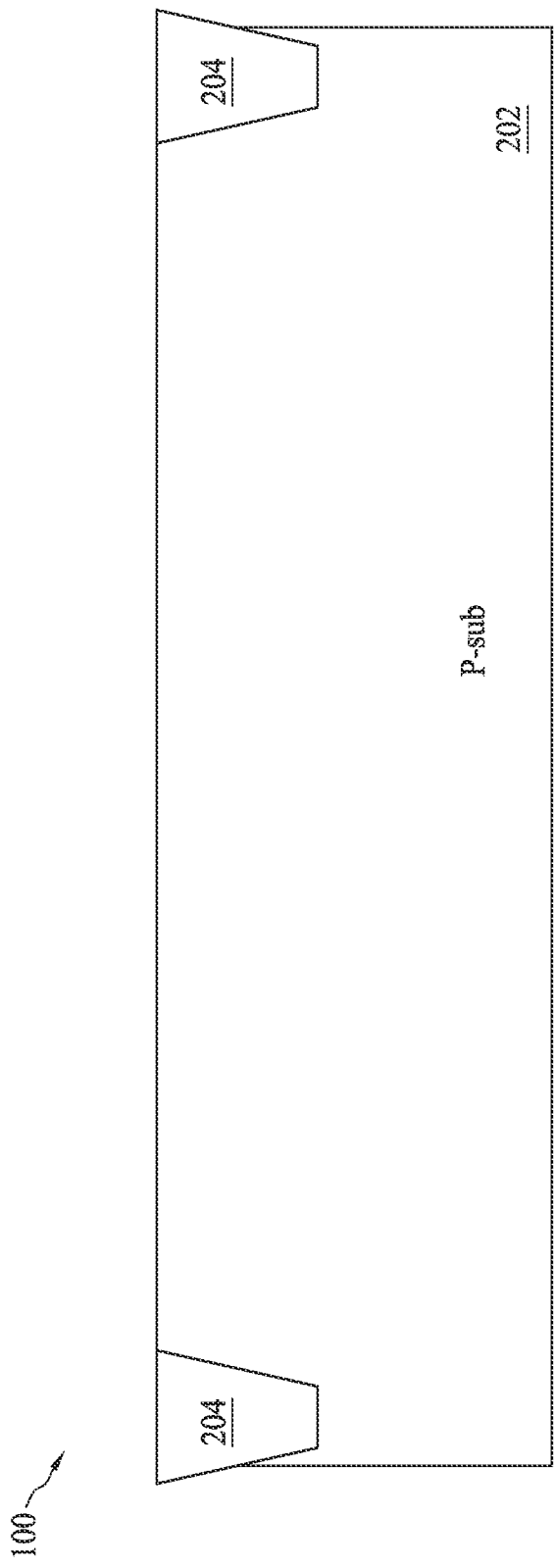
FIGS. 1-11 are diagrams illustrating a high voltage semiconductor device at various stages of fabrication according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1-11 are diagrams illustrating a high voltage semiconductor device 100 at various stages of fabrication according to an exemplary embodiment of the present disclosure. It is noted that FIGS. 1-11 have been simplified for a better understanding of the disclosed embodiment. Moreover, the high voltage semiconductor device 100 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have an operating (or drain) voltage of 1.1 V with standard CMOS technology, or 1.8/2.5/3.3 V with special (input/output) transistors in standard CMOS technology. In addition, transistors that provide medium/high voltage functionality may have an operating (or drain) voltage of 5 V or greater (e.g., 20-35 V). It is understood that the high voltage semiconductor device 100 may also include resistors, capacitors, inductors, diodes, and other suitable microelectronic devices that are typically implemented in integrated circuits. In the present embodiment, the high voltage semiconductor device 100 includes an n-type high voltage MOS (NHVMOS) device.

Referring to FIG. 1, a semiconductor substrate 202 is provided. The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. Moreover, the substrate 202 may include an alloy semiconductor such as silicon germanium, silicon germanium carbide, gallium arsenic phosphide, and gallium indium phosphide. In an embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an n-type buried layer (NBL), a p-type buried layer (PBL), and/or a buried dielectric layer including a buried oxide (BOX) layer. In the present embodiment, illustrated as an n-type HVMOS, the substrate 202 includes a p-type silicon substrate (p-substrate). To form a complementary HVMOS, an n-type buried layer, i.e., deep n-well (DNW), may be implanted deeply under the active region of the p-type HVMOS of the p-substrate 202.

Isolation feature structures 204 such as shallow trench isolations (STI) or local oxidation of silicon (LOCOS) including isolation features may be formed in the substrate 202 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 2:
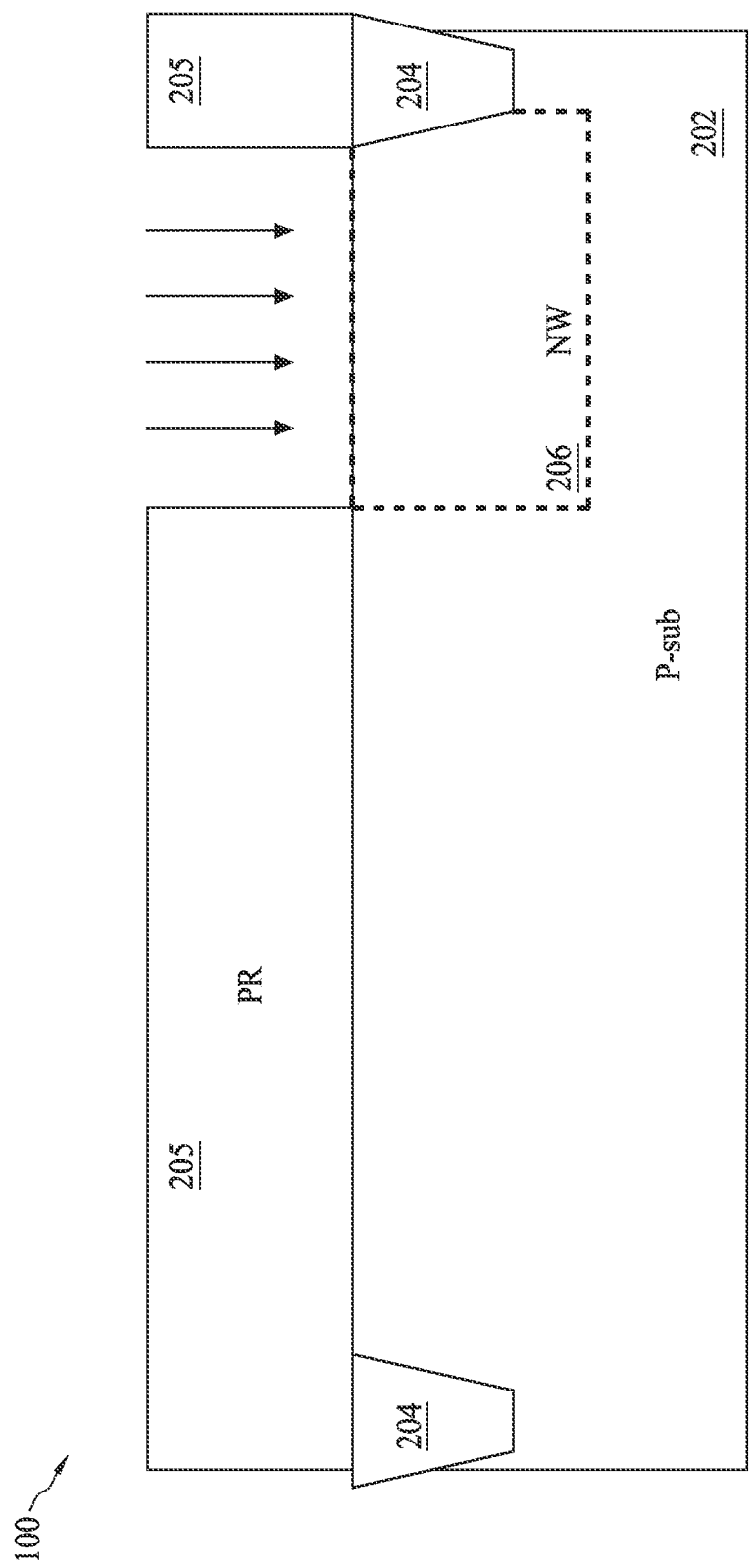

In FIG. 2, an N-well (NW) 206 is formed in various regions of the P-substrate 202 by ion-implantation or diffusion techniques known in the art. For example, an N-well mask is used to pattern a photoresist layer 205 in a photolithography process or other suitable process. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the N-well (NW) 206 in the substrate 202. The N-well 206 may be referred to as an extended drain of the NHVMOS device.

Figure 3:
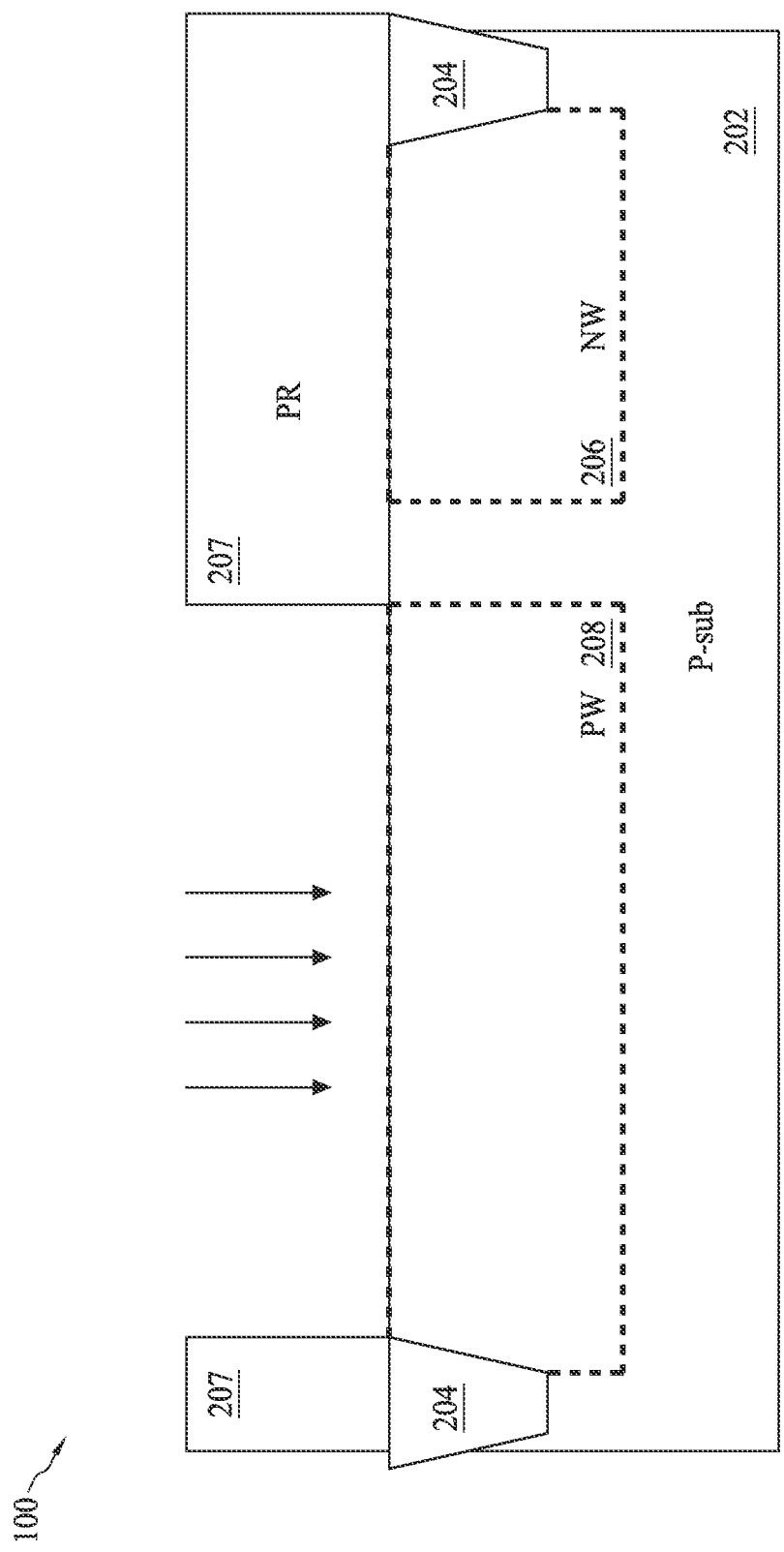

In FIG. 3, a first P-well (1$^{st}$ PW) 208 is formed in various regions of the P-substrate 202 by ion-implantation or diffusion techniques known in the art. For example, the first P-well 208 may be formed by implanting p-type doping materials such as boron, gallium, aluminum, indium, combinations thereof, or the like. The first P-well 208 may be formed in a similar manner as discussed above for the N-well 206. A P-well mask is used to pattern a photoresist layer 207 that protects the N-well 206. An ion implantation utilizing a p-type dopant, such as boron, may be performed to form the first P-well 208 in the region where a source feature will be subsequently formed. It is noted that other ion implantation processes may also be performed to adjust threshold voltages of the core NMOS and PMOS devices in other active regions of the substrate 202, as is known in the art.

Figure 4:
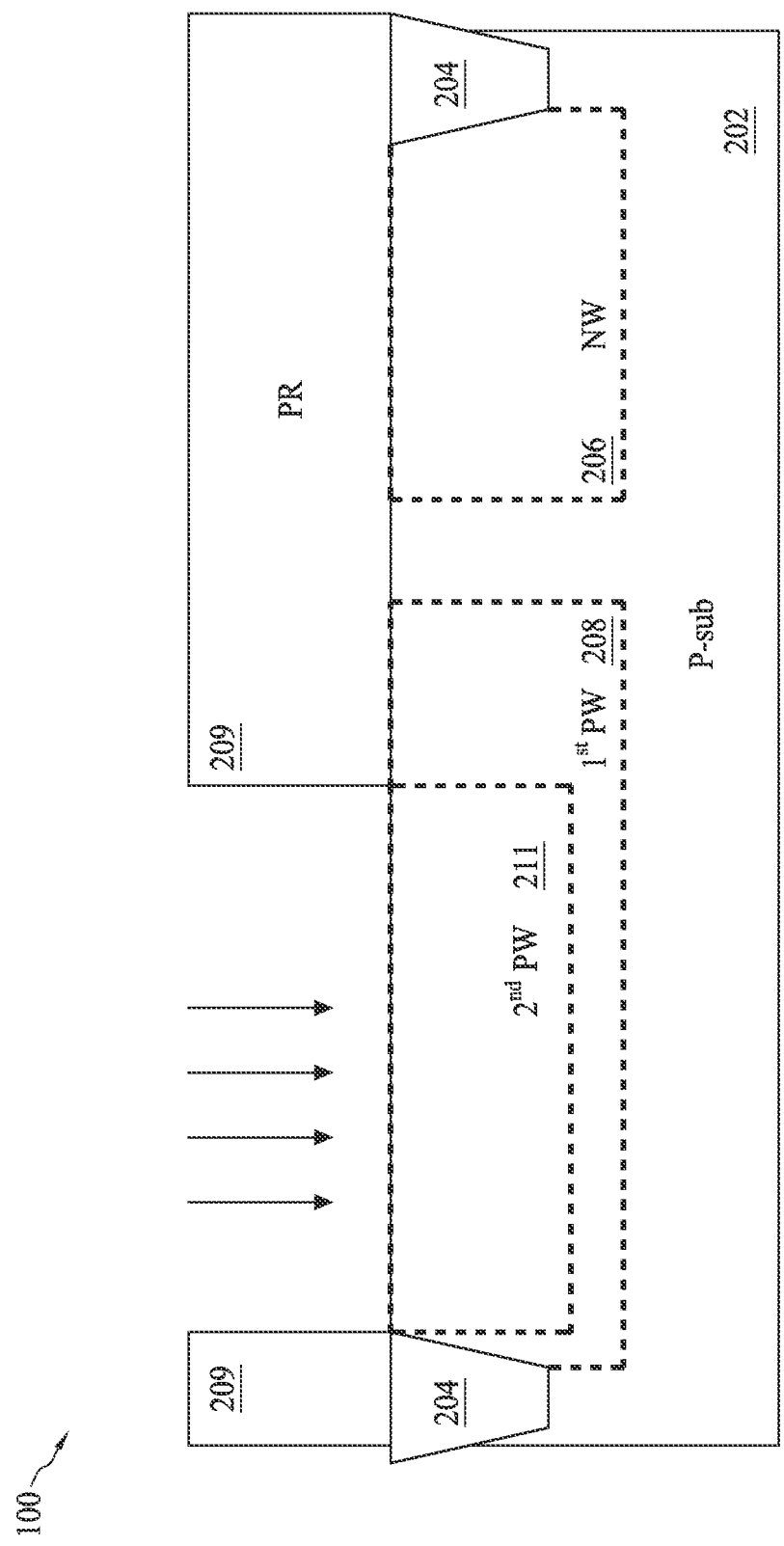

In FIG. 4, a second P-well (2$^{nd}$ PW) 211 may be formed in various regions of the P-substrate 202 by ion-implantation or diffusion techniques known in the art. For example, the second P-well 211 may be formed by implanting p-type doping materials such as boron, gallium, aluminum, indium, combinations thereof, or the like. The second P-well 211 may be formed in a similar manner as discussed above for the N-well 206 and the first P-well 208. A P-well mask is used to pattern a photoresist layer 209 that protects the N-well 206 and the first P-well 208. An ion implantation utilizing a p-type dopant, such as boron, may be performed to form the second P-well 211 in the region where a source feature will be subsequently formed. It is noted that other ion implantation processes may also be performed to adjust threshold voltages of the core NMOS and PMOS devices in other active regions of the substrate 202, as is known in the art. As the second P-well 211 is embedded in the first P-well 208, the combined doping density is higher than the conventional P-well formed by a single 5V CMOS process. The combined doping density of the P-wells is in a range from about $10^{17}/cm^3$ to about $10^{18}/cm^3$.

Figure 5:
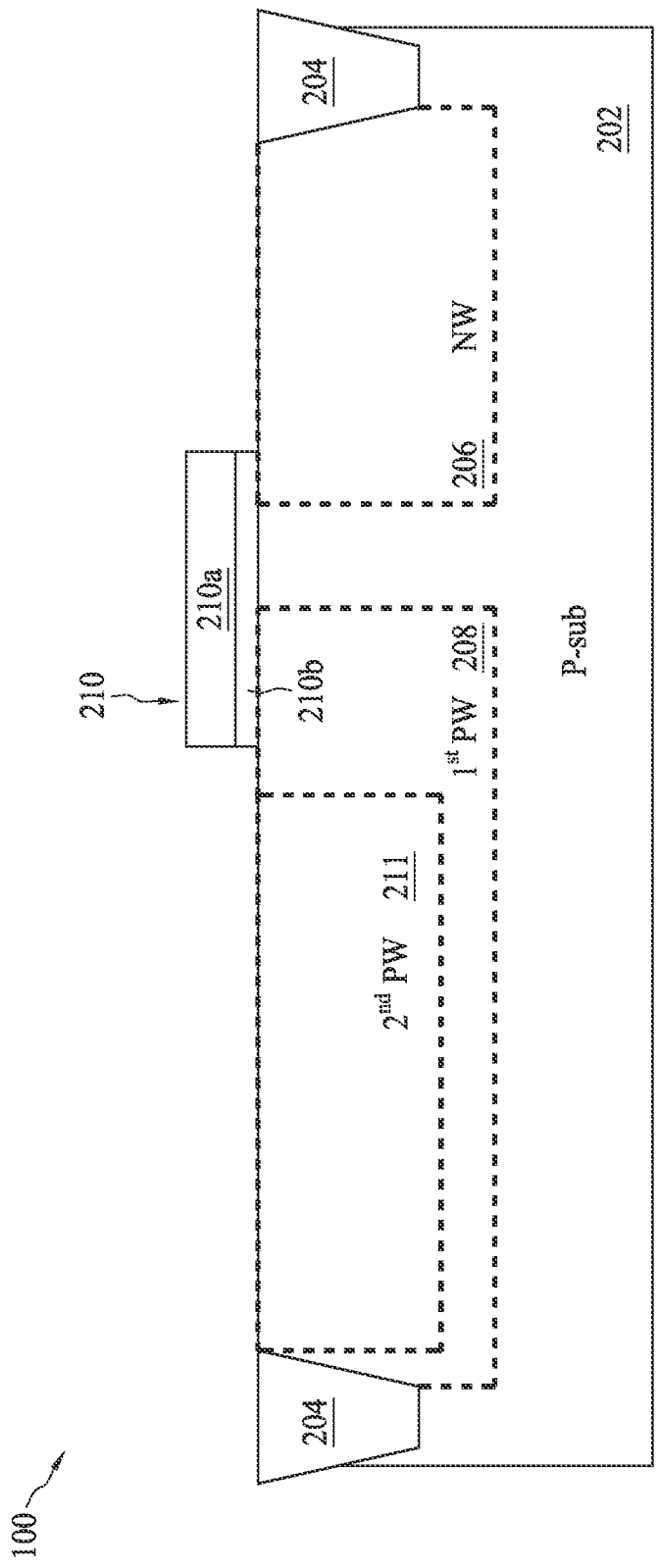

In FIG. 5, a gate structure 210 is formed on the semiconductor substrate 202. In this embodiment, the gate structure 210 includes a gate dielectric layer 210b formed on the substrate 202, and a gate electrode 210a formed on the gate dielectric layer 210b. Further, the gate structure 210 overlies a portion of the N-well 206 and a portion of the first P-well 208. The gate dielectric layer 210b may include a silicon oxide layer. Alternatively, the gate dielectric layer 210b may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric layer 210b may have a multilayer structure such as one layer of silicon oxide and another layer of high k material. The gate dielectric layer 210b may be formed using chemical vapor deposition (CVD), physical vapor deposition (PVD), atomic layer deposition (ALD), thermal oxide, other suitable processes, or combinations thereof.

The gate electrode 210a may be configured to be coupled to metal interconnects and may be disposed overlying the gate dielectric layer 210b. The gate electrode 210a may include a doped polycrystalline silicon (or polysilicon). Alternatively, the gate electrode 210a may include a metal such as Al, Cu, W, Ti, Ta, TiN, TaN, NiSi, CoSi, other suitable conductive materials, or combinations thereof. The gate electrode 210a may be formed by CVD, PVD, plating, and other proper processes. The gate electrode 210a may have a multilayer structure and may be formed in a multi-step process using a combination of different processes.

The gate dielectric layer 210b and the gate electrode 210a formed on the substrate 202 are then patterned to form a plurality of gate structures using a process including photolithography patterning and etching. An exemplary method for patterning the gate dielectric layer 210b and the gate electrode 210a is described below. A layer of photoresist is formed on the polysilicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectrics, in a plurality of processing steps and various proper sequences. The photoresist layer may be stripped thereafter. In another embodiment, only the gate electrode 210a is patterned. In still another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode 210a. The hard mask layer may include silicon nitride, silicon oxynitride, silicon carbide, and/or other suitable dielectric materials, and may be formed using a method such as CVD or PVD.

Figure 6:
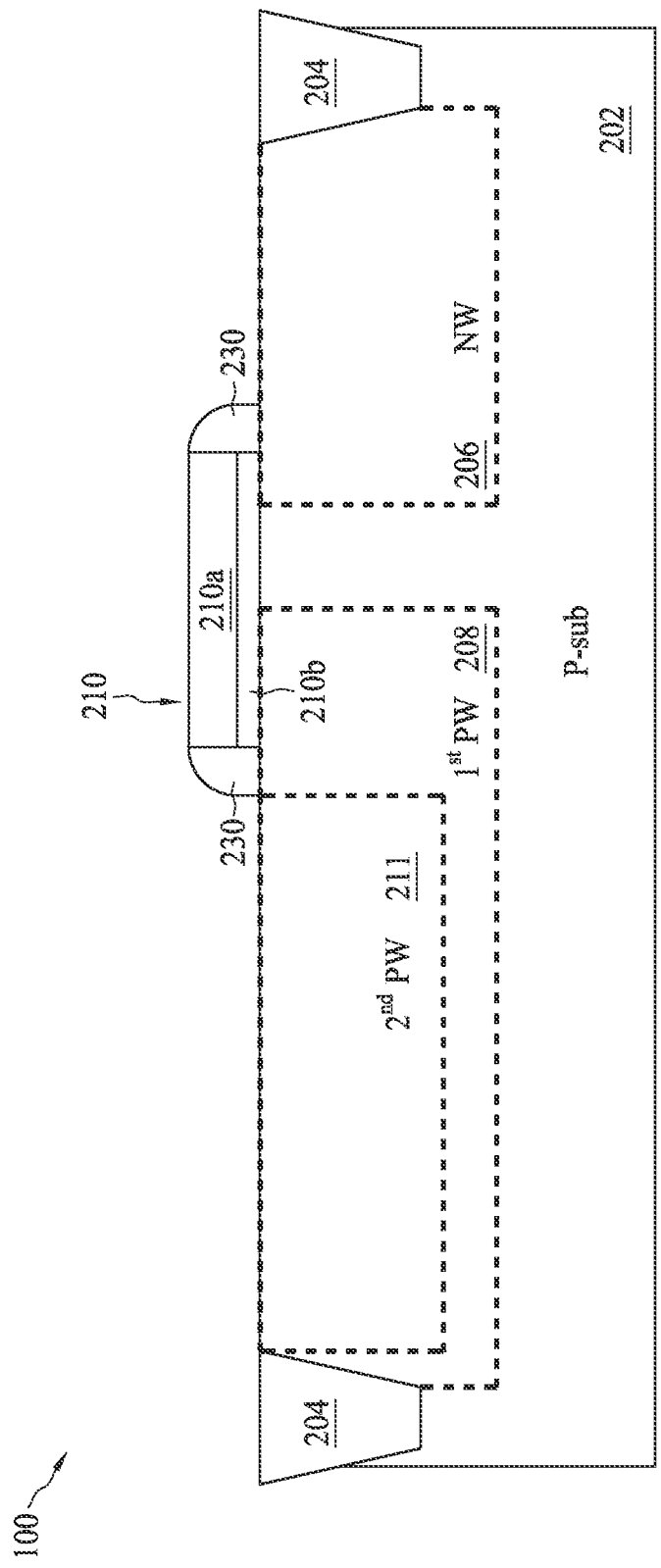

In FIG. 6, sidewall spacers 230 are formed on both sides of the gate structure 210. The sidewall spacers 230 may include a dielectric material such as silicon oxide. Alternatively, the sidewall spacers 230 may optionally include silicon nitride, silicon carbide, silicon oxynitride, or combinations thereof. In some embodiments, the sidewall spacers 230 may have a multilayer structure. The sidewall spacers 230 may be formed by deposition and etching (anisotropic etching technique) as is known in the art.

Figure 7:
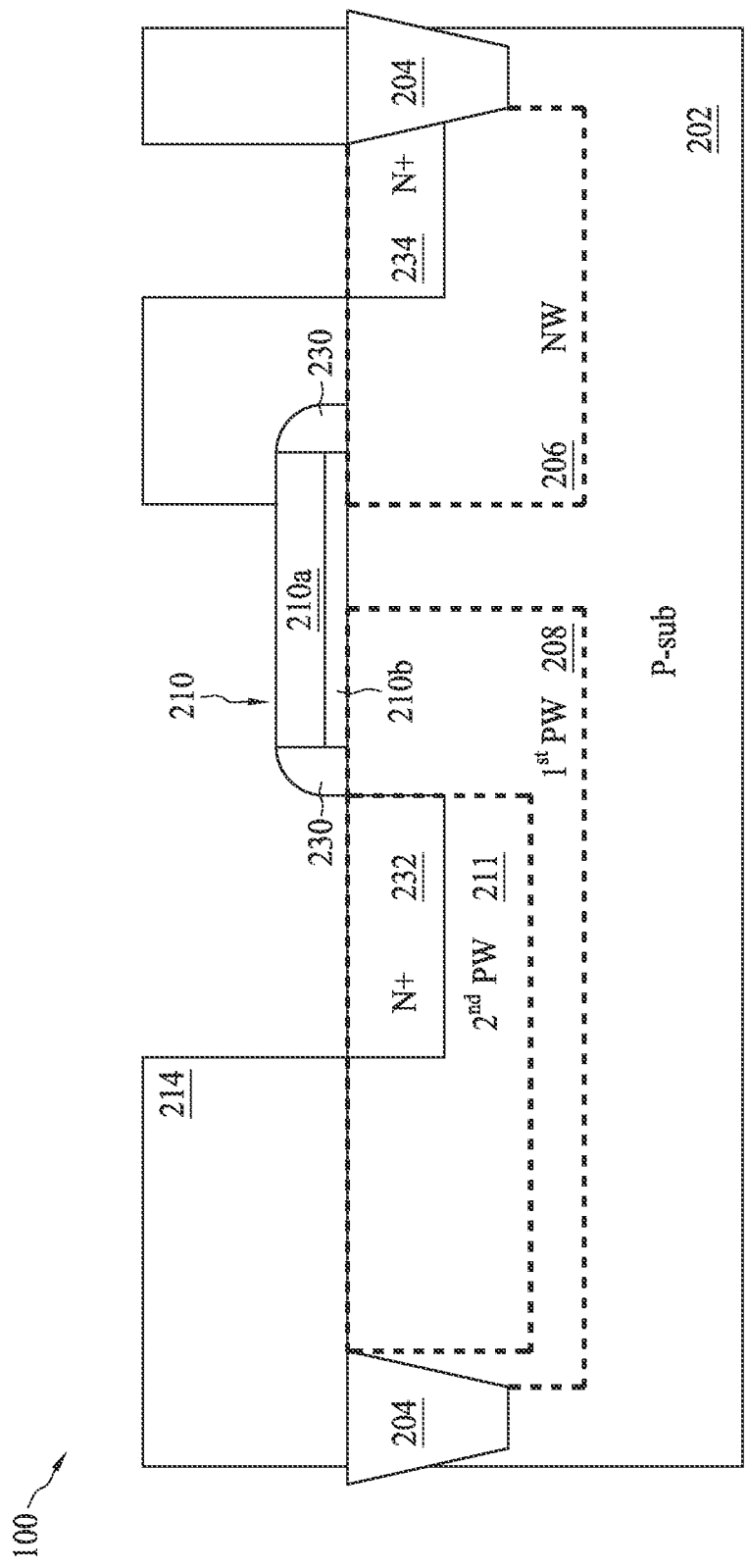

In FIG. 7, a source region 232 is formed in the second P-well 211 and a drain region 234 is formed in the N-well 206, where the source region 232 and drain region 234 are n-type (referred to as N+ or heavily doped regions). The n-type source region 232 and the n-type drain region 234 may be positioned at opposite sides of the gate structure 210 and spaced apart thereby. In some embodiments, the source region 232 may be substantially self-aligned to one of the sidewall spacers. Further, the drain region 234 may be separated from the other one of the sidewall spacers. Accordingly, a patterned photoresist layer 214 may protect a portion of the semiconductor substrate 202 that extends beyond an outer edge of the other one of the sidewall spacers. In the present embodiment, the source region 232 and the drain region 234 include n-type dopants such as P or As. The source region 232 and the drain region 234 may be formed by a method such as ion implantation or diffusion.

In some embodiments, the source region 232 may be formed by implanting an n-type dopant such as phosphorous at a concentration of between about $10^{19}/cm^3$ and about $10^{20}/cm^3$. Moreover, the drain region 234 may be formed by implanting an n-type dopant such as phosphorous at a concentration of between about $10^{19}/cm^3$ and about $10^{20}/cm^3$. A rapid thermal annealing (RTA) process may be used to activate the implanted dopant. In various embodiments, the source region 232 and the drain region 234 may have different doping profiles formed by multi-process implantation. It should be noted that a process to form a source/drain of a p-type (referred to as P+ or heavily doped regions) may be performed for the PMOS devices in the other active regions of the substrate. Accordingly, the NMOS devices including the present embodiment may be protected by the patterned photoresist layer 214.

Figure 8:
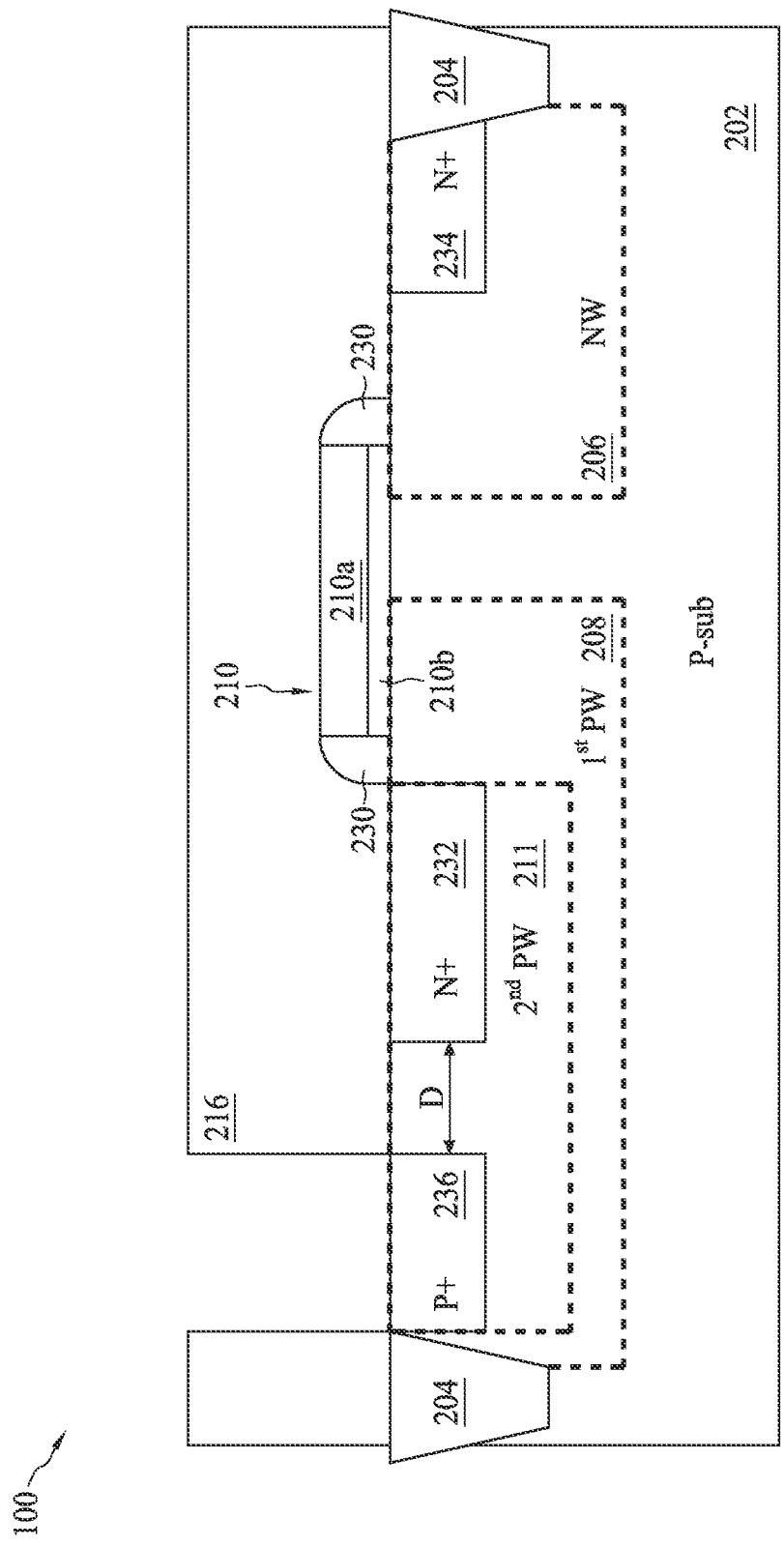

In FIG. 8, a p-type pickup region 236 (referred to as P+ or heavily doped regions) is formed in the second P-well 211, where the source region 232 and drain region 234 are n-type. The pickup region 236 may be part of a P+ pickup ring. The P+ pickup ring may surround the drain region 234 and the source region 232. As such, there may be another P+ region at the right side of the drain region 234 from the cross section view. However, the P+ region at the right side of the drain region 234 is omitted here for brevity. The pickup region 236 is formed adjacent to the source region 232 and separated from the source region 232 by a distance D.

The pickup region 236 may be formed by implanting a p-type dopant such as boron at a concentration of between about $10^{19}/cm^3$ and about $10^{20}/cm^3$. The pickup region 236 may be coupled to the p-type body (the substrate 202) of the semiconductor device 100 through the second P-well 211 and the first P-well 208. In order to eliminate the body effect, the pickup region 236 may be coupled to the source region 232 directly through a source contact.

Figure 9:
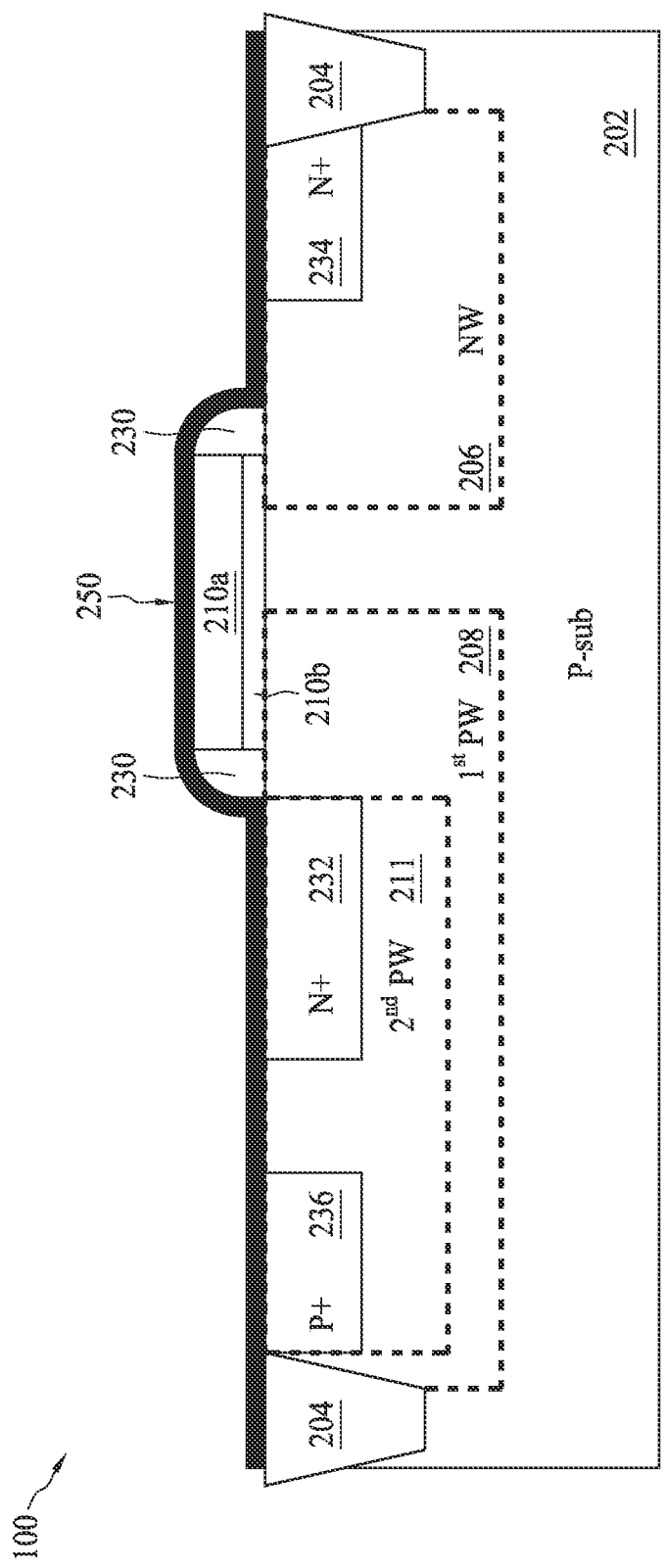
Figure 10:
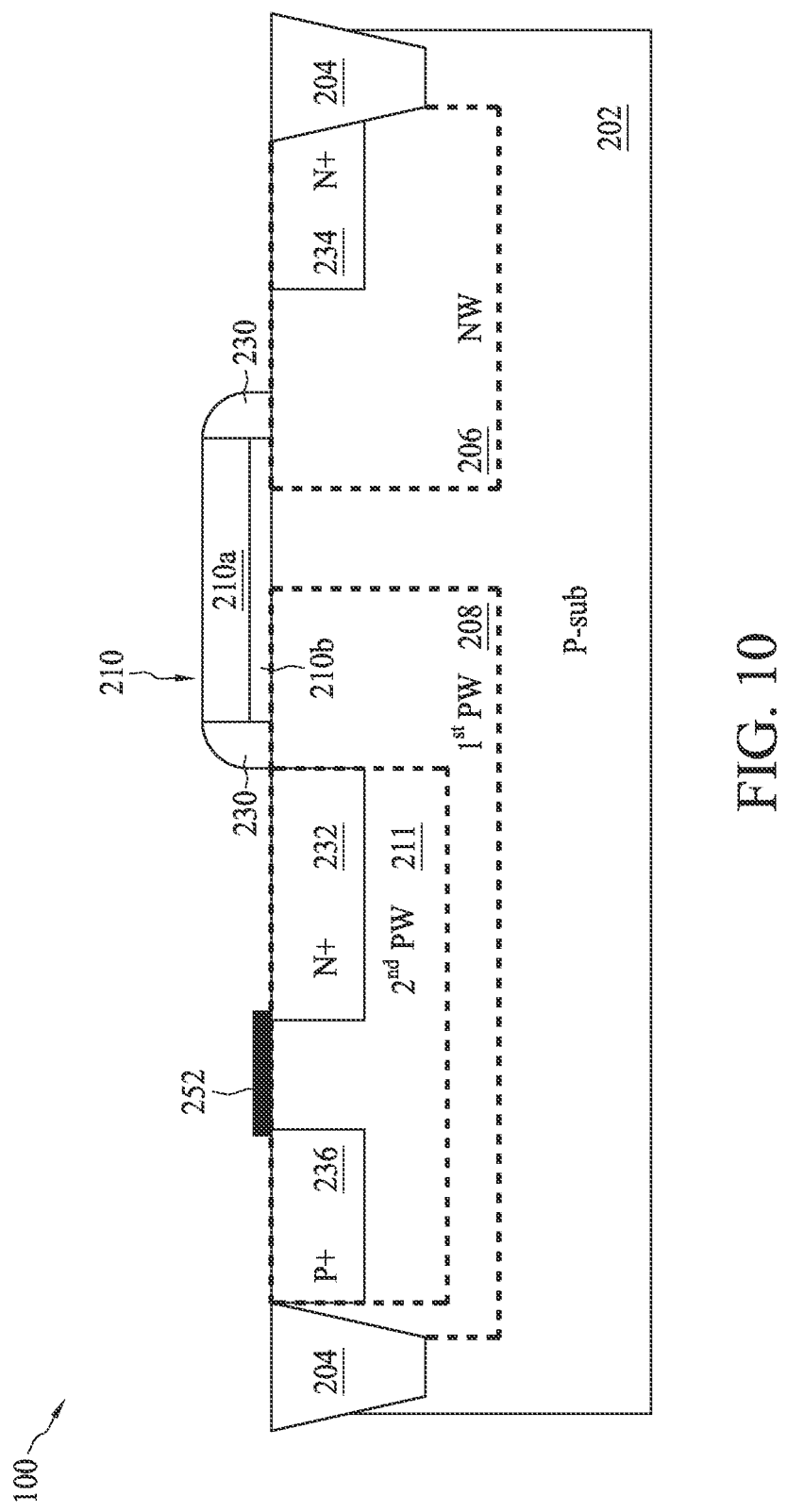

In FIG. 9, a resist protective oxide (RPO) layer 250 is formed over the gate structure 210, the sidewall spacers 230, the source region 232, the drain region 234, the pickup region 236 and the isolation feature structures 204. The RPO layer 250 serves as a dielectric film, and includes silicon dioxide in an embodiment. Examples of alternate dielectric films that can be used for the PRO layer 250 are silicon nitride, silicon oxynitride, oxygen-doped silicon nitride, and/or nitrided oxides. In FIG. 10, the RPO layer 250 of FIG. 9 is partially etched away, leaving the RPO layer 252 over at least a portion between the pickup region 236 and the source region 232. The RPO layer 252 may function as a silicide blocking layer during a subsequent self-aligned silicide (silicide) process discussed below. The device area that does not use the silicide process is covered with the RPO layer 252. The RPO layer 252 can be defined by applying, for example, an oxide wet etch that partially removes the RPO layer 250. This protects the areas under the RPO layer 252 from the silicide formation.

Compared to existing semiconductor devices in the field, the present disclosure eliminates an isolation feature structure such as STI between the pickup region 236 and the source region 232. In this way, substrate current can flow to the pickup region 236 in a shorter path without taking a long detour that would otherwise be required in the existing structures, thereby preventing a parasitic bipolar junction transistor (BJT) from being triggered. As a result, an increased breakdown voltage of the semiconductor device 100 can be obtained. As mentioned above, the pickup region 236 is formed adjacent to the source region 232 and separated from the source region 232 by the distance D. The distance D is configured to be greater than a threshold distance in order to avoid electrically conducting between the pickup region 236 and the source region 232 in the second P-well 211.

In the exemplary embodiment of FIG. 10, the RPO layer 252 can block the surface of the second P-well 211 between the pickup region 236 and the source region 232 from a subsequent silicide process. In particular, the RPO layer 252 fully covers the surface of the second P-well 211 between the pickup region 236 and the source region 232, and the RPO layer 252 may further extend to the pickup region 236 and/or the source region 232 for a specified distance.

Figure 11:
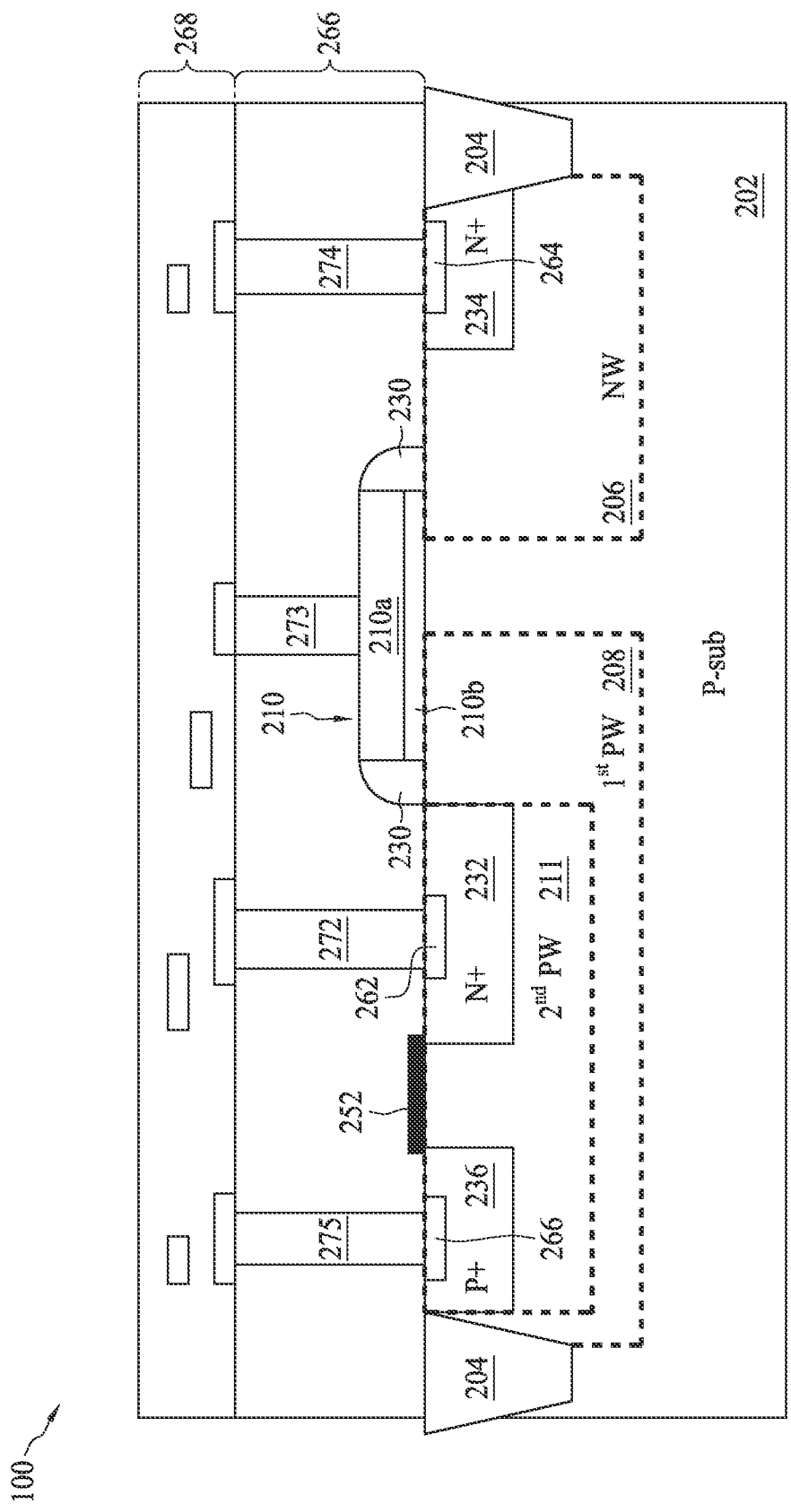

It is understood that the semiconductor device 100 may undergo further CMOS processing as is known in the art. For example, the semiconductor device 100 may further include forming various contacts and metal features on the substrate 202. Silicide features may be formed by silicidation, such as salicide, in which a metal material is formed next to an Si structure, then the temperature is raised to anneal and cause a reaction between underlying silicon and the metal so as to form silicide, and the un-reacted metal is etched away. The salicide material may be self-aligned to be formed on various features such as the source region 232, the drain region 234 and/or the gate electrode 210a to reduce contact resistance. In that case, a source salicide region 262 is formed in the source region 232, a drain salicide region 264 is formed in the drain region 234, and a P+ salicide region 266 is formed in the pickup region 236, as shown in FIG. 11.

Also, a plurality of patterned dielectric layers and conductive layers are formed on the substrate 202 in order to form multilayer interconnects configured to couple the various p-type and n-type doped regions in the substrate 202, such as the source region 232, the drain region 234, and the gate electrode 210a. In an embodiment, an interlayer dielectric (ILD) layer 266 and a multilayer interconnect (MLI) structure 268 are formed in a configuration such that the ILD layer 266 separates and isolates each metal layer from other metal layers. In furtherance of the example, the MLI structure 268 includes contacts, vias and metal lines formed on the substrate 202. In one example, the MLI structure 268 may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connections (vias and contacts) and horizontal connections (conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD layer 266 includes silicon oxide. Alternatively or additionally, the ILD layer 266 includes a material having a low dielectric constant such as a dielectric constant less than about 3.5. In an embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on coating, CVD, or other suitable processes.

The MLI structure 268 and the ILD layer 266 may be formed in an integrated process, such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for the ILD layer 266. During the damascene process, a trench is formed in a dielectric layer, and copper is filled in the trench. As shown in FIG. 11, a trench 272 filled with metal, such as copper, is formed in the ILD layer 266 to interconnect the source salicide region 262 of the source region 232 to the upper MLI structure 268; a trench 274 filled with metal, such as copper, is formed in the ILD layer 266 to interconnect the drain salicide region 264 of the drain region 234 to the upper MLI structure 268; a trench 273 filled with metal, such as copper, is formed in the ILD layer 266 to interconnect the gate electrode 210a to the upper MLI structure 268; and a trench 271 filled with metal, such as copper, is formed in the ILD layer 266 to interconnect the RPO layer 252 to the upper MLI structure 268 and further to the source region 232. As is known in the art, a chemical mechanical polishing (CMP) technique may be implemented afterward to etch back and planarize the substrate surface.

Among various embodiments, the present method and structure provide an enhanced performance high voltage device. By removing the isolation feature structure between the pickup region 236 and the source region 232, and implementing the RPO layer 252 at least covers the surface of the second P-well 211 between the pickup region 236 and the source region 232, the breakdown voltage and the operating bandwidth can be significantly increased without sacrificing the conductive resistance compared to an existing structure having an STI feature intentionally disposed in a substrate between a source region and a P+ region coupled to a p-type body. Moreover, the high voltage device and method of making the same disclosed herein may be fabricated with the same process that is used to form NMOS and PMOS devices (CMOS process flow) for a logic device (low voltage) without requiring additional photomask and/or other processes. Therefore, the cost for fabricating SoC that includes both high voltage and logic devices is kept low.

The disclosed structure and method may have various embodiments, modifications and variations. The high voltage device may not be limited to an n-type MOS device and can be extended to a p-type MOS device with a similar structure and configuration, except that all doping types may be reversed and with a DNW buried substrate. The corresponding dimensions are modified according to the design for the desired transistor performance. Further embodiments may also include, but are not limited to, vertical diffused metal-oxide-semiconductor (VDMOS), other types of high power MOS transistors, Fin structure field effect transistors (FinFET), and strained MOS structures.

One embodiment of the present disclosure provides a semiconductor structure. The semiconductor structure includes: a substrate of a first conductivity; a first region of the first conductivity formed in the substrate; a second region of the first conductivity formed in the first region, wherein the second region has a higher doping density than the first region; a source region of a second conductivity formed in the second region; a drain region of the second conductivity formed in the substrate; a pickup region of the first conductivity formed in the second region and adjacent to the source region; and a resist protective oxide (RPO) layer formed on a top surface of the second region.

One embodiment of the present disclosure provides a semiconductor structure. The semiconductor structure includes: a substrate of a first conductivity; a gate structure formed on the substrate; a region of the first conductivity formed in the substrate; a source region of a second conductivity formed in the region; a drain region of the second conductivity formed in the substrate; and a pickup region of the first conductivity formed in the region and adjacent to the source region; wherein the source region and the pickup region is not separated by an isolation feature structure in the region.

One embodiment of the present disclosure provides a method for fabricating a semiconductor structure. The method includes: providing a substrate of a first conductivity; forming a first region of the first conductivity in the substrate; forming a second region of the first conductivity in the first region, wherein the second region has a higher doping density than the first region; forming a gate structure on the substrate; forming a source region of a second conductivity in the second region; forming a drain region of the second conductivity in the substrate; forming a pickup region of the first conductivity in the second region and adjacent to the source region; and forming a resist protective oxide (RPO) layer on a top surface of the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, comprising:
   providing a substrate of a first conductivity;
   forming a first region of the first conductivity in the substrate;
   forming a second region of the first conductivity in the first region, wherein the second region has a higher doping density than the first region;
   forming a gate structure on the substrate, wherein a sidewall of the gate structure aligns with a sidewall of the second region;
   forming a source region of a second conductivity in the second region, wherein a sidewall of a sidewall spacer of the gate structure vertically aligns with an interface of the second region and the source region and an interface of the first region and the second region;
   forming a drain region of the second conductivity in the substrate, wherein the drain region is adjacent to and separated from the first region;
   forming a pickup region of the first conductivity in the second region and separated from the source region by a distance greater than a threshold distance;
   forming a resist protective oxide (RPO) layer over the substrate,
   wherein the RPO layer covers a portion of the second region between the source region and the pickup region; and
   performing a silicidation on an exposed portion of the substrate thereby forming a plurality of salicide regions, wherein the RPO layer is unaligned with any of the plurality of silicide regions.

2. The method of claim 1, further comprising:
   exposing the drain region and the pickup region prior to the silicidation.

3. The method of claim 1, wherein the RPO layer further covers at least a portion of the pickup region or a portion of the drain region.

4. The method of claim 1, wherein the formation of the RPO layer comprises:
   forming the RPO layer including silicon dioxide over the substrate to cover at least the second region and the drain region.

5. The method of claim 1, further comprising:
   forming an interlayer dielectric (ILD) layer over the substrate and contacting the RPO layer, the source region, the drain region and the pickup region.

6. The method of claim 1, wherein the PRO layer contacts a top surface of the second region and exposes an entirety of the drain region and an entirety of the pickup region.

7. The method of claim 1, wherein the formation of the gate structure comprises: forming sidewall spacers on each side of the gate structure.

8. The method of claim 1, wherein the semiconductor structure is a high voltage device.

9. A method for fabricating a semiconductor structure, comprising:
   forming a substrate of a first conductivity;
   forming a first region of the first conductivity and a second region of a second conductivity adjacent to the first region in a substrate;
   forming a source region of the second conductivity in the first region and a drain region of the second conductivity in the second region;
   forming a pickup region of the first conductivity in the first region and separated from the source region by a distance greater than a threshold distance;
   forming the dielectric film over the substrate to cover at least the first region and the second region;
   etching away portions of the dielectric film, wherein a remaining portion of the dielectric film covers a portion of a top surface of the first region between the source region and the pickup region; and
   forming a first salicide at a surficial portion of the source region, a second salicide at a surficial portion of the drain region, and a third salicide at a surficial portion of the pickup region, wherein the dielectric film is unaligned with any of the first silicide, the second silicide, and the third salicide.

10. The method of claim 9, further comprising:
    forming a gate structure over the substrate after the formation of the first region and the second region, wherein the gate structure covers a portion of the substrate between the first region and the second region.

11. The method of claim 10, wherein the gate structure overlaps a portion of the first region by a first width and a portion of the second region by a second width, and the first width is different from the second width.

12. The method of claim 10, further comprising:
    forming a third region of the first conductivity in the second region prior to the formation of the source region and the drain region, wherein a horizontal distance between the third region and the gate structure is greater than zero.

13. The method of claim 9, further comprising:
    forming an interlayer dielectric (ILD) layer over the substrate covering the remaining portion of the dielectric film.

14. The method of claim 13, wherein the ILD layer includes through trenches filled by conductive material.

15. The method of claim 14, further comprising:
    forming a multilayer interconnect (MLI) structure on the ILD layer, wherein the pickup region is coupled to the source region via the through trenches and the MLI structure.

16. A method for fabricating a semiconductor structure, comprising:
    forming a gate structure on a substrate of a first conductivity;
    forming a source region of a second conductivity in the substrate;
    forming a pickup region of the first conductivity in the substrate at a first side of the source region and separated from the source region by a distance greater than a threshold distance;
    forming a drain region of the second conductivity in the substrate at a second side of the source region opposite to the first side;
    forming a dielectric film covering a top surface of the substrate after the forming of the gate structure;
    etching away the dielectric film except a portion of the dielectric film disposed between the source region and the pickup region, wherein the portion of the dielectric film disposed between the source region and the pick region extends to cover a portion of the source region and a portion of the pickup region; and forming an interlayer dielectric (ILD) layer over the substrate and the unetched portion of the dielectric film, the ILD layer being in contact with the unetched portion of the dielectric film, the source region, the drain region and the pickup region.

17. The method of claim 16, wherein a sidewall of the unetched portion of the dielectric film is aligned with a sidewall of the source region or a sidewall of the pickup region.

18. The method of claim 16, wherein the dielectric film includes silicon oxynitride.

19. The method of claim 17, wherein the formation of the dielectric film comprises:

forming an oxygen-doped silicon nitride layer covering an entirety of the substrate.

20. The method of claim 17, wherein the formation of the dielectric film comprises:

forming a nitrided oxides layer covering an entirety of exposed surfaces of the substrate.

\* \* \* \* \*